(12) United States Patent
Micks et al.

(10) Patent No.: US 10,176,634 B2
(45) Date of Patent: ***Jan. 8, 2019

(54) LANE BOUNDARY DETECTION DATA GENERATION IN VIRTUAL ENVIRONMENT

(71) Applicant: Ford Global Technologies, LLC, Dearborn, MI (US)

(72) Inventors: Ashley Elizabeth Micks, Mountain View, CA (US); Venkatapathi Raju Nallapa, Fairfield, CA (US); Brielle Reiff, Cincinnati, OH (US); Vidya Nariyambut Murali, Sunnyvale, CA (US); Sneha Kadetotad, Sunnyvale, CA (US)

(73) Assignee: FORD GLOBAL TECHNOLOGIES, LLC, Dearborn, MI (US)

( * ) Notice: Subject to any disclaimer, the term of this patent is extended or adjusted under 35 U.S.C. 154(b) by 140 days.

This patent is subject to a terminal disclaimer.

(21) Appl. No.: 14/885,099

(22) Filed: Oct. 16, 2015

(65) Prior Publication Data

US 2017/0109928 A1    Apr. 20, 2017

(51) Int. Cl.
*G06T 19/00* (2011.01)
*G06F 17/50* (2006.01)
(Continued)

(52) U.S. Cl.
CPC ........ *G06T 19/003* (2013.01); *G06F 17/5095* (2013.01); *G06K 9/00798* (2013.01);
(Continued)

(58) Field of Classification Search
None
See application file for complete search history.

(56) References Cited

U.S. PATENT DOCUMENTS

| 4,530,056 A | * | 7/1985 | MacKinnon | ......... | G05D 1/0238 |
| | | | | | 180/168 |
| 5,522,250 A | * | 6/1996 | Gee | ..................... | F02D 41/1495 |
| | | | | | 73/1.07 |

(Continued)

FOREIGN PATENT DOCUMENTS

| CN | 103207090 | 7/2013 |
| CN | 103164579 | 6/2015 |

(Continued)

OTHER PUBLICATIONS

Wang et al ("A Lane Departure Warning System Developed under a Virtual Environment", 2014, ICCSS).*

(Continued)

*Primary Examiner* — Xin Sheng
(74) *Attorney, Agent, or Firm* — David R. Stevens; Stevens Law Group

(57) ABSTRACT

A method and an apparatus pertaining to generating training data. The method may include executing a simulation process. The simulation process may include traversing one or more virtual sensors over a virtual driving environment defining a plurality of lane markings or virtual objects that are each sensible by the one or more virtual sensors. During the traversing, each of the one or more virtual sensors may be moved with respect to the virtual driving environment as dictated by a vehicle-dynamic model modeling motion of a vehicle driving on a virtual road surface of the virtual driving environment while carrying the one or more virtual sensors. Virtual sensor data characterizing the virtual driving environment may be recorded. The virtual sensor data may correspond to what an actual sensor would produce in a real-world environment that is similar or substantially matching the virtual driving environment.

19 Claims, 4 Drawing Sheets

(51) Int. Cl.
    *G06K 9/00*      (2006.01)
    *G06K 9/62*      (2006.01)
    *G09B 9/00*      (2006.01)
    *G09B 9/042*     (2006.01)

(52) U.S. Cl.
    CPC ............ *G06K 9/6262* (2013.01); *G09B 9/00* (2013.01); *G09B 9/042* (2013.01)

(56) References Cited

U.S. PATENT DOCUMENTS

| | | | | |
|---|---|---|---|---|
| 9,062,979 | B1* | 6/2015 | Ferguson | G01C 21/30 |
| 9,583,020 | B1* | 2/2017 | Kronfeld | G09B 19/00 |
| 2005/0192736 | A1 | 9/2005 | Sawada | |
| 2013/0321401 | A1* | 12/2013 | Piemonte | G01C 21/3635 |
| | | | | 345/419 |

FOREIGN PATENT DOCUMENTS

| | | |
|---|---|---|
| KR | 20000013675 | 3/2000 |
| KR | 101357596 | 2/2014 |

OTHER PUBLICATIONS

Templeton ("Robotic Driving Simulator", 2014, https://web.archive.org/web/20140707235915/http://www.templetons.com/brad/robocars/simulator.html).*

Gruyer et al (Aug. 2010. "Pro-sivic and roads. a software suite for sensors simulation and virtual prototyping of adas", In Proceedings of DSC (pp. 277-288)).*

Grapinet, et al (2013, "Characterization and simulation of optical sensors", Accident Analysis & Prevention, 60, pp. 344-352).*

Integration of a lane detection system in a virtual environment to test and evaluate active safety and autonomous driving, Jul. 31, 2015, Joakim Olsson.

* cited by examiner

US 10,176,634 B2

LANE BOUNDARY DETECTION DATA GENERATION IN VIRTUAL ENVIRONMENT

TECHNICAL FIELD

The present disclosure generally relates to vehicular systems and, more particularly, to methods and systems for generating training data suitable for use in developing, training, testing and proving algorithms for detecting lane boundaries in a driving environment.

BACKGROUND

To provide, enable, or otherwise support functionalities such as driver assistance, controlling vehicle dynamics, and/or autonomous driving, well proven algorithms for interpreting sensor data are indispensable. In particular, algorithms for detecting boundaries of driving lanes are vital. Presently, real-world sensor data are relied upon for developing, training, testing and proving such algorithms. However, it is expensive, in terms of time, money and resources, to acquire a useful amount of real-world data.

BRIEF DESCRIPTION OF THE DRAWINGS

Non-limiting and non-exhaustive embodiments of the present disclosure are described with reference to the following figures, wherein like reference numerals refer to like parts throughout the various figures unless otherwise specified.

DETAILED DESCRIPTION

Figure 1:
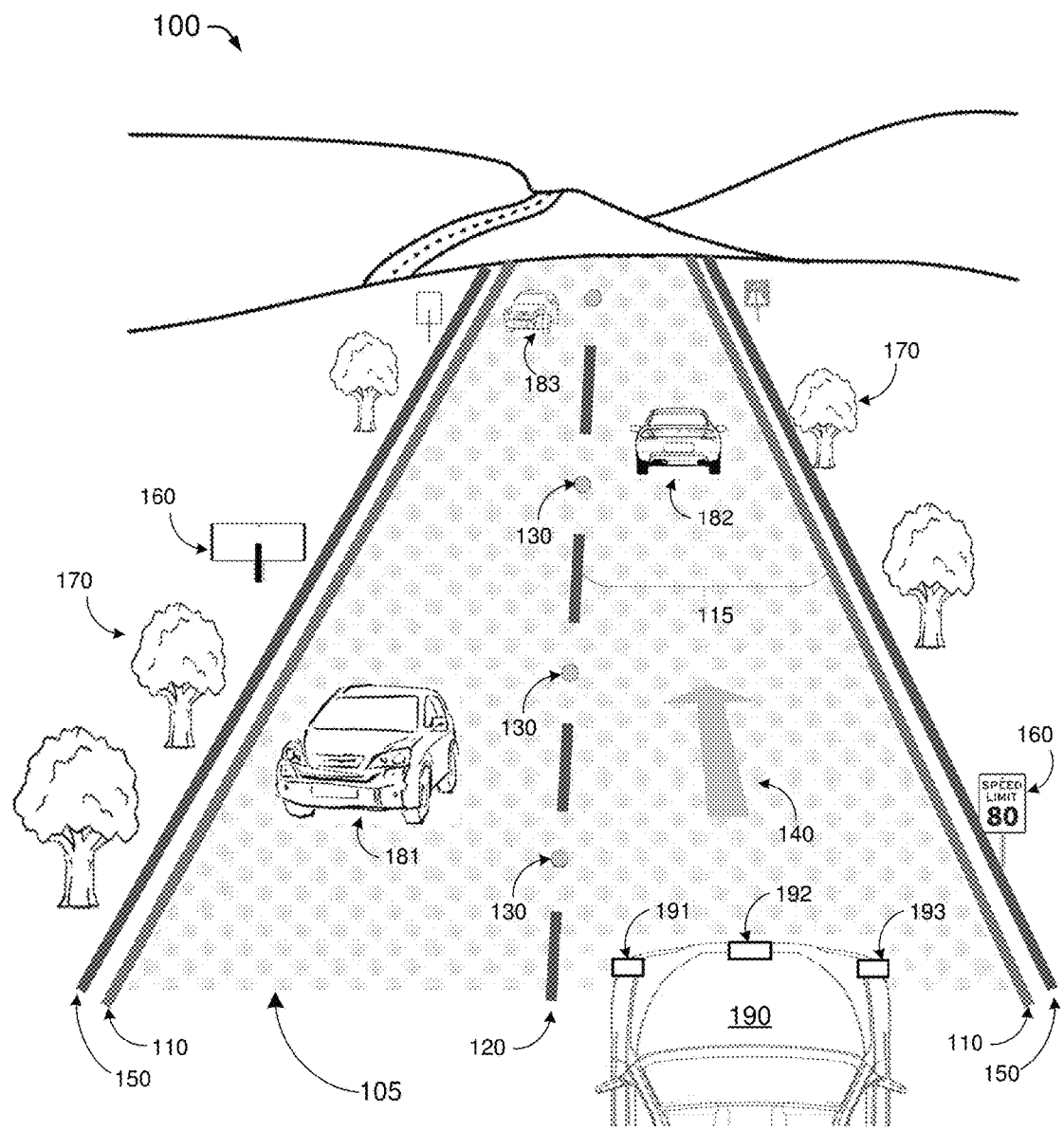
FIG. 1 is a diagram depicting an example environment in which example embodiments of the present disclosure may be implemented.

In the following description, reference is made to the accompanying drawings that form a part thereof, and in which is shown by way of illustrating specific exemplary embodiments in which the disclosure may be practiced. These embodiments are described in sufficient detail to enable those skilled in the art to practice the concepts disclosed herein, and it is to be understood that modifications to the various disclosed embodiments may be made, and other embodiments may be utilized, without departing from the scope of the present disclosure. The following detailed description is, therefore, not to be taken in a limiting sense.

In the development of lane boundary detection algorithms to detect lane boundaries with a variety of markings or without markings, diverse sets of sensor data are needed to train, develop, test and prove the lane boundary detection algorithms and additional downstream functions associated with the algorithms. However, it usually takes considerable money, time and resources to acquire real-world sensor data. For example, to obtain real-word sensor data, sensors need to be physically mounted on a vehicle, and actual driving runs need to be performed on various types of road and for various traffic conditions for the sensors to collect sensor data for each scenario. In addition, ambient variables such as weather, temperature, wind, light conditions and other weather-related factors tend to increase the number of sets of sensor data to be collected by multiple orders of magnitude. In general, sensor data for thousands of miles of road are needed to develop a lane boundary detection algorithm, and thus considerable amount of time, money and resources are required to acquire such data.

The scenarios are further complicated, and the sensor data to be collected further expanded, when different types of vehicles (such as different makes/models) with different kinds of sensors equipped at different locations of the vehicles are taken into consideration. Moreover, characteristics of a particular vehicle, as well as characteristics of the various sensors mounted thereon, may change or drift over time due to factors such as aging or accumulation of odometer mileage, among others. In other words, a lane boundary detection algorithm that is developed and well-trained for a new vehicle with low mileage may not be as effective or accurate after the vehicle is put to service for a few years.

The present disclosure provides a solution to overcome the difficulties, and reduce the cost, of acquiring sensor data needed for a lane boundary detection algorithm by generating the sensor data utilizing a virtual environment. Various scenarios, conditions and parameters as mentioned above can be easily set up virtually in the virtual environment, and a virtual vehicle equipped with virtual sensors can traverse or drive about the virtual environment in a simulation and virtually collect (i.e., generate by simulation) the sensor data needed for the lane boundary detection algorithm. The virtual environment, virtual vehicle and virtual sensors are modeled to closely match the corresponding real-world environment, real-world vehicle and real-world sensors such that the simulation-generated virtual sensor data can substantially represent the same information collected by the real-world sensor in the real-world environment.

FIG. 1 illustrates an example environment 100 which is a virtual environment in which example embodiments of the present disclosure may be implemented. In example environment 100, a road surface 105 may be designed to allow either one-way or two-way automobile traffic to travel thereon. Traffic on each direction may have one or more driving lanes 115. Road surface 105 may be provided with one or more lines such as a line 110 and a line 120, for example, as lane markings to identify or otherwise designate a driving lane 115 on road surface 105. In some embodiments, road surface 105 may include other markings as lane markings such as, for example, a plurality of surface reflectors 130. Either or both of lines 110 and 120 may be solid, broken or in another pattern, and may be of any color and any texture. For illustrative purpose and not limiting the scope of the present disclosure, in FIG. 1, line 110 is shown as a solid line and line 120 is shown as a broken line. In some embodiments, road surface 105 may have other kinds of markings such as, for example, an arrow sign 140 or other symbols or text painted or disposed on road surface 105. In some embodiments, one or more or all kinds of markings and lines mentioned above may be absent on road surface 105 to simulate certain kinds of road surfaces such as, for example, country roads, dirt roads, unpaved roads, private roads, and roads covered with debris, mud, or snow.

In some embodiments, road surface 105 may be provided with one or more road structures such as traffic dividers dividing a driving lane from another driving lane. In some embodiments, one or more roadside structures such as road shoulders, side rails or curbs 150 may be provided alongside the road surface 105 in a direction parallel with the automobile traffic, on either side or both sides of road surface 105. In some embodiments, objects such as traffic signs 160, commercial signs or billboards may also be provided alongside the road surface 105 in a direction parallel with the automobile traffic. Traffic signs or other signs may also be provided above road surface 105 where the automobile traffic is not affected.

In some environments, objects such as bushes, trees or other plants 170, and other structures such as lampposts, power posts, utility poles or buildings may be provided alongside the road surface 105 in a direction parallel with the automobile traffic.

A virtual vehicle with one or more virtual sensors mounted thereon may be utilized in environment 100 for generation of sensor data. For example, a vehicle 190 as illustrated in FIG. 1 may traverse environment 100 by driving on road surface 105 within driving lane 115. One or more sensors, such as sensors 191, 192 and 193, may be mounted on vehicle 190 and utilized, while vehicle 190 traverses on road surface 105, to characterize environment 100 by generating certain sensor data according to specific characteristics of each of the sensors 191, 192 and 193. The sensor data may be recorded and later utilized in developing a lane boundary detection algorithm, a software procedure programmed to identify or otherwise determine lane boundaries of the one or more driving lanes 115 within environment 100. For example, sensors 191, 192 and 193 mounted on vehicle 190 may characterize environment 100 by identifying and/or recording certain characteristics of some or all of the objects, structures, markings and lines present in environment 100 as mentioned above, including lines 110 and 120, surface reflectors 130, markings or text 140, road shoulders or side rails 150, signs 160, as well as trees or other plants 170. In addition, sensors 191, 192 and 193 mounted on vehicle 190 may also characterize and record other vehicles present in environment 100, moving either in the same or opposite direction of vehicle 190, such as vehicles 181, 182 and 183 as illustrated in FIG. 1. Sensor data corresponding to characterization of other vehicles such as vehicles 181, 182 and 183 may be utilized by the lane boundary detection algorithm to aid in identifying or otherwise determining the lane boundaries.

The approach taken by the present disclosure to realize a low-cost and efficient solution for acquisition of sensor data is by substantially transforming from real world to a virtual space items and objects illustrated in FIG. 1, as well as the traversal of the sensor-carrying vehicle and the characterization of the environment. Namely, every item depicted in FIG. 1 is modeled to represent an actual object in the real world, and can also represent a virtual object in a virtual space. In general, such a system that performs the real-word-to-virtual space transformation as well as the virtual sensor data generation is realized by utilizing a computing device or one or more processors.

Figure 2:
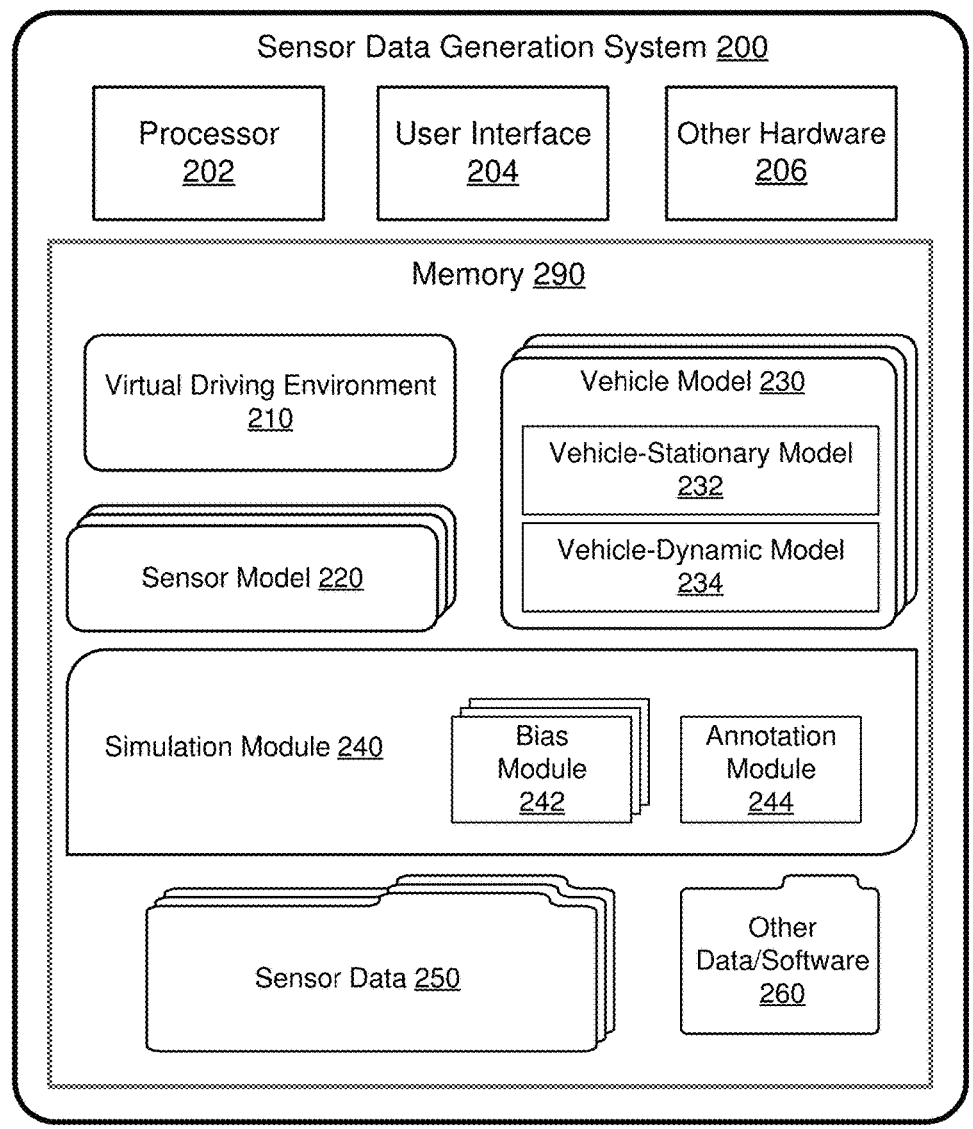
FIG. 2 is a block diagram depicting an example apparatus in accordance with an embodiment of the present disclosure.

FIG. 2 illustrates an example sensor data generation system 200 in which example embodiments of the present disclosure may be implemented. Sensor data generation system 200 may execute a simulation in order to produce sensor data 250 suitable for developing, testing, and/or training various lane boundary detection algorithms. Sensor data generation system 200 may do this in any suitable method. For example, sensor data generation system 200 may be embodied as hardware, software, or some combination thereof.

In some embodiments, sensor data generation system 200 may include computer hardware and computer software. The computer hardware of sensor data generation system 200 may include one or more processors 202, memory 290, a user interface 204, other hardware 206 such as, for example, a field-programmable gate array (FPGA) or a graphics processing unit (GPU), or the like or a combination or sub-combination thereof. Memory 290 may be operably connected to or otherwise accessible by the one or more processors 202, and may be configured to store the computer software for execution by the one or more processors 202.

User interface 204 may enable a user, e.g., an engineer, technician or the like, to interact with, run, customize, or control various aspects of sensor data generation system 200. In some embodiments, user interface 204 may include one or more keypads, keyboards, touch screens, pointing devices, or the like or a combination or sub-combination thereof.

In some embodiments, memory 290 may store data, codes and/or instructions pertaining to or otherwise defining one or more virtual driving environments 210. The one or more virtual driving environments 210 may contain various virtual objects, structures and markings as shown in FIG. 1. Memory 290 may also store one or more sensor models 220, one or more vehicle models 230, a simulation module 240, sensor data 250, other data or software 260 (such as "ground truth" information extracted from virtual driving environment 210 or codes programmed to visually display sensor data 250 through user interface 204) or the like, or combinations or sub-combinations thereof.

In some embodiments, virtual driving environment 210 may include a three dimensional mesh defining in a virtual space locations, orientations, sizes, shapes, colors, surface reflectiveness and other characteristics of some or all of the stationary objects, structures, markings and lines present in environment 100 as illustrated in FIG. 1, including lines 110 and 120, surface reflectors 130, markings or text 140, road shoulders or side rails 150, signs 160, as well as trees or other plants 170. In some embodiments, virtual driving environment 210 may also define characteristics of other moving objects such as vehicles 181, 182 and 183 as illustrated in FIG. 1, including but not limited to speed, moving direction, acceleration/deceleration and turning of each of the other moving objects.

In some embodiments, each sensor model 220 may be a software model that defines or predicts for certain situations or views the output of a corresponding real-world sensor. In certain embodiments, each sensor model 220 may be provided with information (e.g., data from a virtual driving environment 210) characterizing various views of a road surface, e.g., road surface 105. With this information, each sensor model 220 may predict what an actual sensor presented with those views in the real world would output.

In some embodiments, real-world sensors of interest may include transducers that sense or detect some characteristic of an environment and provide a corresponding output (e.g., an electrical or optical signal or an image) that defines that characteristic. For example, one or more real-world sensors of interest may be accelerometers that output an electrical signal characteristic of the proper acceleration being experienced thereby. Such accelerometers may be used to determine the orientation, acceleration, velocity, and/or distance traveled by a vehicle. Other real-world sensors of interest may include cameras, laser scanners, light-detection-and-ranging (LIDAR) scanners, ultrasonic transducers, radar devices, gyroscopes, inertial measurement units, revolution counters or sensors, strain gauges, temperature sensors, or the like.

Each sensor model 220 may be used to model the output produced by a real-world sensor of interest. For example, sensor model 220 may be used to model sensors 191, 192 and 193 mounted on vehicle 190, as illustrated in FIG. 1. As the outputs may be different for different real-world sensors, accordingly, in some embodiments, a given sensor model 220 may correspond to a specific type of real-word sensor. That is, one sensor model 220 may be suited to model the output of a particular type of sensor (e.g., a particular kind of camera), while another sensor model 220 may be suited to model the output of another type of sensor (e.g., a particular radar scanner).

Each sensor model 220 may produce an output of any suitable format. For example, in some embodiments, a sensor model 220 may output an analog signal that a corresponding real-world sensor would produce. Alternatively, a sensor model 220 may output a processed signal, such as a digitized and filtered version of an analog signal. For example, a sensor model 220 may output a processed signal such as one output by a data acquisition system. Accordingly, in some embodiments, the output of a sensor model 220 may be a conditioned, digital version of the signal that a corresponding real-world sensor would produce.

Each of the one or more vehicle models 230 is configured to model a respective sensor-mounted vehicle that traverses on a road surface in a driving environment, such as vehicle 190 of FIG. 1. Similar to sensor models 220, vehicle models 230 may be different for different types of real-world vehicles (e.g. different make/model of an automobile). A specific make/model of a vehicle (e.g., a particular sports car) may be modeled by a respective vehicle model 230 that is distinctive from another vehicle model 230 used to model another vehicle of different make/model (e.g., a particular pickup truck).

In general, a vehicle model 230 may include two sub-models: a vehicle-stationary model 232 and a vehicle-dynamic model 234. With the two sub-models, the traversal of a vehicle within virtual driving environment 210 may be modeled to a reasonably accurate degree. Vehicle-stationary model 232 may be a software model that defines certain stationary characteristics of a corresponding type of vehicle. In some embodiments, a set of parameters may be used to record dimensions of the corresponding type of vehicle. The set of parameters may also include information regarding planned locations of one or more sensors mounted on the corresponding type of vehicle. Vehicle-dynamic model 234 may be a software model that defines certain dynamic characteristics of a corresponding type of vehicle in response to external forces or impacts. In some embodiments, vehicle-dynamic model 234 may include characteristics of chassis and/or suspension dynamics of a corresponding type of vehicle to certain fidelity.

In some embodiments, vehicle-dynamic model 234 may be provided with one or more driver inputs (e.g., one or more values characterizing parameters such as velocity, drive torque, brake actuation, steering input, or the like or combinations or sub-combinations thereof) and information (e.g., data from a virtual driving environment 210) characterizing a road surface. With these inputs and information, vehicle-dynamic model 234 may predict motion states of the body of a corresponding type of vehicle.

The parameters of vehicle-dynamic model 234 may be determined or specified in any suitable manner. In some embodiments, certain parameters of vehicle-dynamic model 234 may be derived from previous knowledge of the mechanical properties (e.g., geometries, inertia, stiffness, damping coefficients, etc.) of a corresponding real-world vehicle. The parameters may be different for different types of vehicles.

Simulation module 240 may be programmed to take a virtual driving environment 210, one or more sensor models 220 and a vehicle model 230 as inputs and subsequently generate an output modeling a real-world output produced by one or more corresponding real-world sensors mounted on a corresponding real-world vehicle (e.g., the vehicle modeled by the vehicle model 230) traversing a real-world driving environment modeled by (e.g., substantially or exactly matching) the virtual driving environment 210. In some embodiments, at least a portion of the output generated by simulation module 240 may be stored in memory 290 as sensor data 250. As previously stated, driving environment 100 may include one or more lane markings such as solid line 110, broken line 120 and surface reflectors 130. In this case, sensor data 250 may include data that directly characterize locations of lane boundaries. Alternatively, in some embodiments, driving environment 100 may not include any or some of the lane markings. In this case, sensor data 250 may include data that characterize other virtual objects defined in virtual driving environment 210, either stationary or mobile, such as text 140, road shoulders or side rails 150, signs 160, trees or other plants 170, as well as other vehicles 181, 182 and 183. Though indirect, data of these virtual objects stored as sensor data 250 may still be utilized by a lane boundary detection algorithm to infer locations of lane boundaries.

In some embodiments, sensor data generation system 200 may include in simulation module 240 one or more bias modules 242. A purpose of a bias module 242 is to account for secondary effects such as weather conditions, time of day, sensor aging and vehicle aging. In real-world scenarios, a sensor may not maintain same characteristics or performance over an indefinitely long period of time. More likely than not, real-world sensors may experience certain aging effects and their characteristics may change or drift over time. Similar situation may happen for real-world vehicles. A bias module 242 included in simulation module 240 may be programmed to account for such effects due to weather conditions, time of day, sensor aging and vehicle aging by adjusting either the output generated by simulation module 240 or the stored sensor data 250 according to a set of bias parameters. In some embodiments, a bias module 242 may be programmed to account for various weather conditions. In some embodiments, a bias module 242 may be programmed to account for lighting conditions that may change from dawn to dust depending on different times of the day. In some embodiments, a bias module 242 may adjust or "bias" one or more sensor models 220 to account for such secondary effects.

An example implementation of bias module 242 may be further illustrated by the following examples. In some embodiments, a sensor model 220 may be a virtual camera that models a real-world visual camera, and thus the corresponding sensor data 250 may be one or more visual images. If the virtual weather condition is raining, the image perceived by the virtual camera would become blurred due to rain and may be disturbed by motion of windshield wipers, as compared to a clear image otherwise perceived under a normal weather condition. As another example, the image perceived under a bright sunlight may have less contrast and thus having a "white out" effect as compared to a clear image under normal daylight condition. These visual effects on the images (e.g. sensor data 250) generated by simulation module 240 may be produced by one or more bias modules

242. In short, the one or more bias modules 242 not only account for various secondary effects, but also facilitate generating a large amount of sensor data 250 under various conditions in an efficient and low-cost way.

Figure 3:
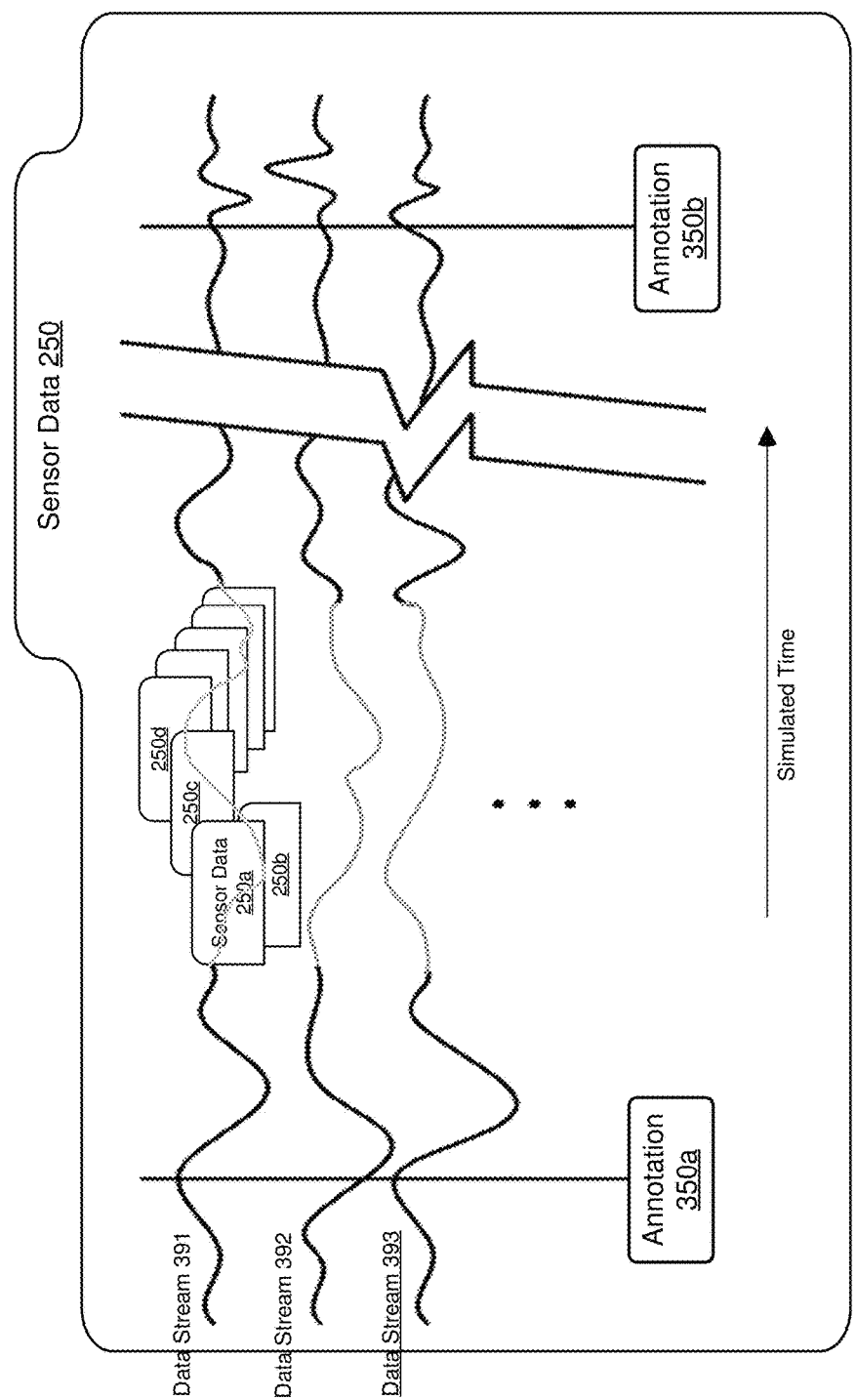
FIG. 3 is a diagram illustrating one embodiment of sensor data tagged with one or more annotations in accordance with the present disclosure.

FIG. 3 illustrates one embodiment of sensor data tagged with one or more annotations in accordance with the present disclosure. Referring to FIG. 1 and FIG. 2 as an example, as virtual vehicle 190 traverses virtual driving environment 100 (or, equivalently, virtual driving environment 210). For each of virtual sensors 191, 192 and 193, sensor data generation system 200 may generate sensor data 250 for each simulated moment over a period of simulated time. For example, also referring to FIG. 3, for a first simulated moment in time, simulation module 240 may generate sensor data 250*a* characterizing virtual driving environment 100 as perceived by a particular virtual sensor 191 at that first moment. Subsequently, for a second simulated moment in time, simulation module 240 may generate sensor data 250*b* characterizing virtual driving environment 210 as perceived by virtual sensor 191 at that second moment. This process may be repeated for a third simulated moment in time (generating sensor data 250*c*), a forth simulated moment in time (generating sensor data 250*d*), and so forth. Accordingly, by advancing from one moment in time to the next, simulation module 240 may generate a data stream 391 characterizing virtual driving environment 210 as perceived by virtual sensor 191 over that simulated period of time. This simulation process may be repeated for all of the virtual sensors (e.g. sensors 191, 192 and 193) mounted on a particular virtual vehicle (e.g. vehicle 190). Accordingly, for the particular virtual vehicle 190 and the virtual driving environment 100 that it has traversed, sensor data 250 comprising one or more data streams (e.g. data streams 391, 392 and 393) may be generated.

In the example shown in FIG. 3, different data streams 391, 392 and 393 may represent the outputs of different virtual sensors 191, 192 and 193. That is, a first data stream 391 may represent the output of a first virtual camera 191 mounted on the front-left corner of virtual vehicle 190, a second data stream 392 may represent the output of a second virtual camera 192 mounted on the front center of virtual vehicle 190, and a third data stream 393 may represent the output of a third virtual camera 193 mounted on the front-right corner of virtual vehicle 190. Collectively, the various data streams 391, 392 and 393 forming the sensor data 250 for a particular run (e.g., a particular virtual traverse of a particular virtual vehicle 190 through a particular virtual driving environment 210) may represent or account for some or all the inputs that a particular algorithm (i.e., the algorithm that is being developed or tested) would use in the real world.

In some embodiments, simulation module 240 may include annotation module 244 programmed to couple sensor data 250 with one or more annotations such as annotation 350*a* and annotation 350*b* shown in FIG. 3. Each annotation may annotate "ground truth" information corresponding to the virtual driving environment 210. In some embodiments, ground truth information includes actual spatial location of lane boundaries as defined within the virtual driving environment 210. As such, ground truth is modeled by virtual driving environment 210, such information is readily available to sensor data generation system 200. In some embodiments, the ground truth information contained in one or more annotations may be used to quantify or evaluate performance of a lane boundary detection algorithm when annotated sensor data 250 are used by the algorithm in a supervised learning approach.

For example, one or more annotations, including annotations 350*a* and 350*b*, may provide "true locations" of the boundaries of lane 115 within which virtual vehicle 190 is driven for a particular run. The true locations of the lane boundaries are defined according to the spatial definition of the lane 115 within the virtual driving environment 100. Annotations 350*a* and 350*b* may be linked, tied to, overlaid upon, or otherwise associated with particular portions of data streams 391, 392 and 393. Accordingly, the ground truth information corresponding to a particular lane 115 may be linked to the portion of data streams 391, 392 and 393 that reflect the perception of virtual sensors 191, 192 and 193 of that boundaries of lane 115. In some embodiments, not all of data streams 391, 392 and 393 may have ground truth information annotated at same temporal portions thereof.

Figure 4:
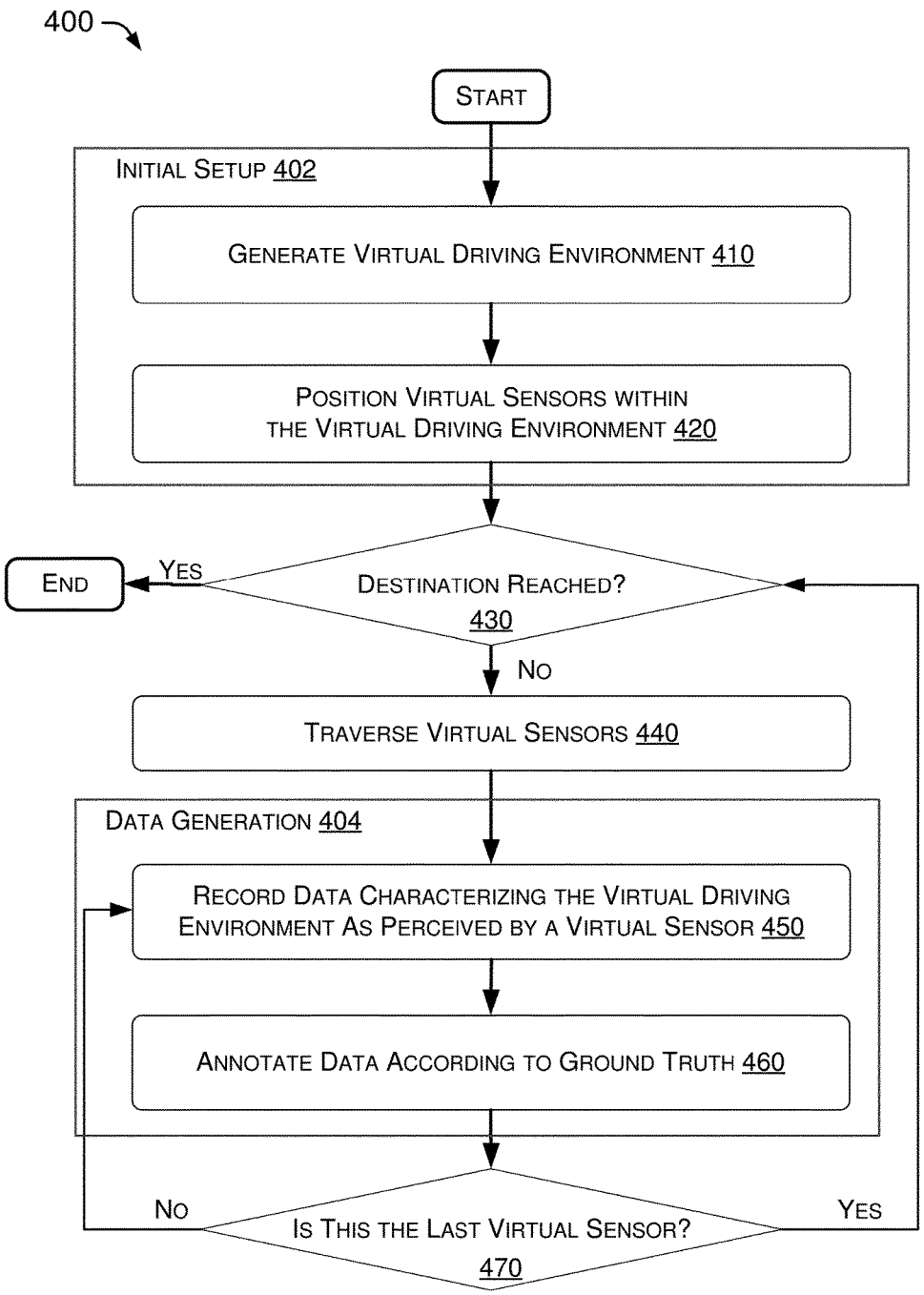
FIG. 4 is a flowchart of an example process in accordance with an embodiment of the present disclosure.

FIG. 4 illustrates an example process 400 in accordance with an embodiment of the present disclosure. Example process 400 may include one or more operations, actions, or functions shown as blocks such as 402, 404, 430, 440 and 470 as well as sub-blocks 410, 420, 450 and 460. Although illustrated as discrete blocks, various blocks may be divided into additional blocks, combined into fewer blocks, or eliminated, depending on the desired implementation. Example process 400 may be implemented in example environment 100 and/or example sensor data generation system 200. For simplicity of description and not limiting the scope thereof, example process 400 is described below in the context of example sensor data generation system 200.

At 402, example process 400 may involve processor 202 setting up virtual driving environment 210. This may involve operations performed at sub-blocks 410 and 420. At 410, example process 400 may involve processor 202 setting up virtual driving environment 210 according to various virtual objects (e.g. as text 140, road shoulders or side rails 150, signs 160, trees or other plants 170, as well as other vehicles 181, 182 and 183), lane markings (e.g. solid line 110, broken line 120 and surface reflectors 130) and virtual sensors (e.g. sensors 191, 192 and 193) shown in FIG. 1. At 420, example process 400 may involve processor 202 and positioning virtual sensors within the virtual driving environment 210 using a vehicle-stationary model 232 of a vehicle model 230. Block 402 may be followed by block 430.

At 430, example process 400 may involve processor 202 determining whether a traversal has reached a predetermined destination. For instance, after initial setup, processor 202 may determine whether or not a traversal has reached a predetermined destination. On one hand, if it is determined that the traversal has reached the predetermined destination, process 400 may end immediately. On the other hand, if it is determined that the traversal has not yet reached the predetermined destination, processor 202 may determine to traverse virtual sensors to a next location within the virtual driving environment, and example process 400 may proceed to 440.

At 440, in response to a determination that the traversal has not yet reached the predetermined destination, example process 400 may involve traversing the virtual sensors to a next location using a vehicle-dynamic model 234 of a vehicle model 230. Block 440 may be followed by block 404.

At 404, example process 400 may involve data generation. This may involve operations performed at sub-blocks 450 and 460. At 450, example process 400 may involve processor 202 recording sensor data 250 generated by simulation module 240 characterizing virtual driving environment 210 as perceived by a virtual sensor modeled by a sensor model 220. At 460, example process 400 may involve annotation module 244 of simulation module 240 annotating sensor data 250 with ground truth information such as locations of lane boundaries as defined in virtual driving environment 210 at various portions in time of the sensor data 250. Block 404 may be followed by block 470.

At 470, example process 400 may involve processor 202 determining, in response to recording annotated data characterizing virtual driving environment 210 as perceived by a virtual sensor, whether the virtual sensor is the last among the virtual sensors sensing the virtual driving environment 210 whose perceptions need to be recorded. On one hand, if it is determined that the virtual sensor is not the last among the virtual sensors sensing the virtual driving environment 210 whose perceptions need to be recorded, processor 202 may proceed to 450 to record annotated data characterizing virtual driving environment 210 as perceived by a next virtual sensor. On the other hand, if it is determined that the virtual sensor is already the last among the virtual sensors sensing the virtual driving environment 210 whose perceptions need to be recorded, processor 202 may proceed to 430 to check again if the traversal has reached the predetermined destination.

In some embodiments, the virtual driving environment may include a virtual road surface having one or more driving lanes. In some embodiments, the virtual road surface may also include a plurality of lane markings corresponding to the one or more driving lanes, each of the plurality of lane markings sensible by the one or more virtual sensors.

In some embodiments, the one or more virtual sensors may include a virtual camera. The data may include one or more virtual images of the virtual driving environment as perceived by the virtual camera. Additionally or alternatively, the one or more virtual sensors may include a virtual light-detection-and-ranging (LIDAR) device, and the data may include virtual lane boundaries as perceived by the LIDAR device.

In some embodiments, the virtual driving environment may also include a plurality of virtual objects distributed therewithin. Each of the virtual objects may be either stationary or mobile relative to the virtual driving environment. Each of the virtual objects may be sensible by the one or more virtual sensors. In some embodiments, the data may include data useful for inferring a location of each of the one or more driving lanes of the virtual road surface as perceived by the one or more virtual sensors sensing one or more of the plurality of virtual objects. In some embodiments, the data may further include an annotation characterizing the location of at least one of the one or more driving lanes according to a spatial definition of the at least one of the one or more driving lanes on the virtual road surface.

In some embodiments, the positioning may include setting a spatial relation for each of the one or more virtual sensors with respect to the virtual driving environment according to a vehicle-stationary model modeling a location of the respective virtual sensor on a virtual vehicle carrying the one or more virtual sensors and driving on a virtual road surface of the virtual driving environment.

In some embodiments, the traversing may include moving each of the one or more virtual sensors with respect to the virtual driving environment according to a vehicle-dynamic model modeling motions of a virtual vehicle carrying the one or more virtual sensors and driving on a virtual road surface of the virtual driving environment.

In some embodiments, the data may include data characterizing a location of each of one or more driving lanes of a virtual road surface as perceived by the one or more virtual sensors sensing one or more of a plurality of lane markings corresponding to the one or more driving lanes. In some embodiments, the data may further include an annotation characterizing the location of at least one of the one or more driving lanes according to a spatial definition of the at least one of the one or more driving lane on the virtual road surface.

In some embodiments, each of the one or more virtual sensors may be associated with one of a plurality of sensor types. Each of the plurality of sensor types may be modeled by a respective sensor model. The respective sensor model may be configured to be biased by a respective set of one or more weather parameters.

The articles "a" and "an" are used herein to refer to one or to more than one (i.e., to at least one) of the grammatical object of the article. By way of example, "a user" means one user or more than one users. Reference throughout this specification to "one embodiment," "an embodiment," "one example," or "an example" means that a particular feature, structure, or characteristic described in connection with the embodiment or example is included in at least one embodiment of the present disclosure. Thus, appearances of the phrases "in one embodiment," "in an embodiment," "one example," or "an example" in various places throughout this specification are not necessarily all referring to the same embodiment or example. Furthermore, the particular features, structures, databases, or characteristics may be combined in any suitable combinations and/or sub-combinations in one or more embodiments or examples. In addition, it should be appreciated that the figures provided herewith are for explanation purposes to persons ordinarily skilled in the art and that the drawings are not necessarily drawn to scale.

Embodiments in accordance with the present disclosure may be embodied as an apparatus, method, or computer program product. Accordingly, the present disclosure may take the form of an entirely hardware-comprised embodiment, an entirely software-comprised embodiment (including firmware, resident software, micro-code or the like), or an embodiment combining software and hardware aspects that may all generally be referred to herein as a "circuit," "module," or "system." Furthermore, embodiments of the present disclosure may take the form of a computer program product embodied in any tangible medium of expression having computer-usable program code embodied in the medium.

The flow diagrams and block diagrams in the attached figures illustrate the architecture, functionality, and operation of possible implementations of systems, methods, and computer program products according to various embodiments of the present disclosure. In this regard, each block in the flow diagrams or block diagrams may represent a module, segment, or portion of code, which comprises one or more executable instructions for implementing the specified logical function(s). It will also be noted that each block of the block diagrams and/or flow diagrams, and combinations of blocks in the block diagrams and/or flow diagrams, may be implemented by special purpose hardware-based systems that perform the specified functions or acts, or combinations of special purpose hardware and computer instructions. These computer program instructions may also be stored in a computer-readable medium that can direct a computer or other programmable data processing apparatus to function in a particular manner, such that the instructions stored in the computer-readable medium produce an article of manufacture including instruction means which implement the function/act specified in the flow diagram and/or block diagram block or blocks.

Although the present disclosure is described in terms of certain embodiments, other embodiments will be apparent to those of ordinary skill in the art, given the benefit of this disclosure, including embodiments that do not provide all of the benefits and features set forth herein, which are also within the scope of this disclosure. It is to be understood that other embodiments may be utilized, without departing from the scope of the present disclosure.

What is claimed is:

1. A method, comprising:
   generating, by a processor via a computer simulation, a virtual driving environment;
   positioning, by the processor via the computer simulation, one or more virtual sensors within the virtual driving environment, the one or more virtual sensors modeled by the computer simulation and not comprising any physical component;
   traversing, by the processor via the computer simulation, the one or more virtual sensors within the virtual driving environment;
   recording, by the processor, data generated by the computer simulation, the data characterizing the virtual driving environment and corresponding to information generated by the one or more virtual sensors sensing the virtual driving environment during the traversing; and
   adjusting, by the processor according to a set of bias parameters via the computer simulation, the data to account for a weather condition, a time of a day having different lighting conditions, sensor aging and vehicle aging.

2. The method of claim 1, wherein the virtual driving environment comprises a virtual road surface having one or more driving lanes.

3. The method of claim 2, wherein the virtual road surface further comprises a plurality of lane markings corresponding to the one or more driving lanes, each of the plurality of lane markings sensible by the one or more virtual sensors.

4. The method of claim 2, wherein the virtual driving environment further comprises a plurality of virtual objects distributed therewithin, each of the virtual objects either stationary or mobile relative to the virtual driving environment, and each of the virtual objects sensible by the one or more virtual sensors.

5. The method of claim 4, wherein the data comprises data useful for inferring a location of each of the one or more driving lanes of the virtual road surface as perceived by the one or more virtual sensors sensing one or more of the plurality of virtual objects.

6. The method of claim 5, wherein the data further comprises an annotation characterizing the location of at least one of the one or more driving lanes according to a spatial definition of the at least one of the one or more driving lanes on the virtual road surface.

7. The method of claim 1, wherein the one or more virtual sensors comprise a virtual camera, and wherein the data comprises one or more virtual images of the virtual driving environment as perceived by the virtual camera.

8. The method of claim 1, wherein the one or more virtual sensors comprise a virtual light-detection-and-ranging (LIDAR) device, and wherein the data comprises virtual lane boundaries as perceived by the LIDAR device.

9. The method of claim 1, wherein the positioning comprises setting a spatial relation for each of the one or more virtual sensors with respect to the virtual driving environment according to a vehicle-stationary model modeling, via the computer simulation, a location of the respective virtual sensor on a virtual vehicle carrying the one or more virtual sensors and driving on a virtual road surface of the virtual driving environment.

10. The method of claim 1, wherein the traversing comprises moving each of the one or more virtual sensors with respect to the virtual driving environment according to a vehicle-dynamic model modeling, via the computer simulation, motions of a virtual vehicle carrying the one or more virtual sensors and driving on a virtual road surface of the virtual driving environment.

11. The method of claim 1, wherein the data comprises data characterizing a location of each of one or more driving lanes of a virtual road surface as perceived by the one or more virtual sensors sensing, via the computer simulation, one or more of a plurality of lane markings corresponding to the one or more driving lanes.

12. The method of claim 11, wherein the data further comprises an annotation characterizing the location of at least one of the one or more driving lanes according to a spatial definition of the at least one of the one or more driving lane on the virtual road surface.

13. The method of claim 1, wherein each of the one or more virtual sensors is associated with one of a plurality of sensor types, wherein each of the plurality of sensor types is modeled by a respective sensor model via the computer simulation, and wherein the adjusting of the data comprises biasing the respective sensor model according to a set of bias parameters accounting for the weather condition, the time of the day having the different lighting conditions, the sensor aging and the vehicle aging.

14. A sensor data generation system, comprising:
   one or more processors; and
   memory operably connected to the one or more processors, the memory storing:
      a virtual driving environment programmed to include a plurality of virtual objects;
      a first software model programmed to model a sensor;
      a second software model programmed to model stationary characteristics of a vehicle carrying the sensor;
      a third software model programmed to model dynamic characteristics of the vehicle carrying the sensor; and
      a simulation module programmed to utilize the virtual driving environment, the first software model, the second software model and the third software model to generate data via a computer simulation, the data modeling an output of the sensor in a real-word scenario in which the sensor is mounted on the vehicle when the vehicle is driven in an actual driving environment similar to or matching the virtual driving environment,
   wherein the simulation module is further programmed to adjust, via the computer simulation, the data according to a set of bias parameters to account for at least a weather condition, a time of a day having a specific lighting condition, sensor aging and vehicle aging.

15. The sensor data generation system of claim 14, wherein the plurality of virtual objects comprise a plurality of lane markings defining one or more driving lanes.

16. The sensor data generation system of claim 14, wherein the memory further stores data corresponding to the output.

17. The sensor data generation system of claim 16, wherein the simulation module is further programmed to annotate the data with an annotation characterizing the location of one or more driving lanes according to a spatial definition of the one or more driving lanes in the virtual driving environment.

18. The sensor data generation system of claim 17, wherein the sensor comprises a virtual camera, and wherein the data comprise one or more virtual images of the virtual driving environment as perceived by the virtual camera.

19. The sensor data generation system of claim 18, wherein the annotation comprises pixel locations of the one or more driving lanes on the one or more virtual images according to the spatial definition of the one or more driving lanes in the virtual driving environment.

* * * * *